United States Patent
Bensahel et al.

(10) Patent No.: US 6,255,149 B1
(45) Date of Patent: Jul. 3, 2001

(54) PROCESS FOR RESTRICTING INTERDIFFUSION IN A SEMICONDUCTOR DEVICE WITH COMPOSITE SI/SIGE GATE

(75) Inventors: Daniel Bensahel; Yves Campidelli; François Martin; Caroline Hernandez, all of Grenoble (FR)

(73) Assignee: France Télécom (FR)

( * ) Notice: Subject to any disclaimer, the term of this patent is extended or adjusted under 35 U.S.C. 154(b) by 0 days.

(21) Appl. No.: 09/403,442

(22) PCT Filed: Feb. 15, 1999

(86) PCT No.: PCT/FR99/00330

§ 371 Date: Oct. 19, 1999

§ 102(e) Date: Oct. 19, 1999

(87) PCT Pub. No.: WO99/43024

PCT Pub. Date: Aug. 26, 1999

(30) Foreign Application Priority Data

Feb. 19, 1998 (FR) .................................................. 98 02026

(51) Int. Cl.[7] .................................................. H01L 21/338
(52) U.S. Cl. .......................... 438/172; 438/178; 438/590; 438/592; 438/593
(58) Field of Search ................................... 438/172, 178, 438/197, 216, 287, 261, 590, 592–3

(56) References Cited

U.S. PATENT DOCUMENTS

| | | | |
|---|---|---|---|
| 4,717,681 * | 1/1988 | Curran ................................ | 438/314 |
| 4,771,013 * | 9/1988 | Curran ................................ | 438/313 |
| 5,250,452 * | 10/1993 | Ozturk et al. ..................... | 438/301 |
| 5,510,278 * | 4/1996 | Nguyen et al. .................... | 438/158 |
| 5,521,108 | 5/1996 | Rostoker et al. . | |
| 5,543,635 * | 8/1996 | Nguyen et al. .................... | 257/66 |
| 5,545,574 * | 8/1996 | Chen et al. ......................... | 438/301 |
| 5,567,638 | 10/1996 | Lin et al. . | |
| 5,571,734 * | 11/1996 | Tseng et al. ....................... | 438/591 |
| 5,712,208 * | 1/1998 | Tseng et al. ....................... | 438/770 |
| 5,861,340 * | 1/1999 | Bai et al. ............................ | 438/592 |
| 5,940,725 * | 8/1999 | Hunter et al. ..................... | 438/592 |
| 6,063,677 * | 5/2000 | Rodder et al. ..................... | 438/592 |
| 6,063,704 * | 5/2000 | Demirlioglu ....................... | 438/592 |
| 6,087,248 * | 7/2000 | Rodder ............................... | 438/592 |
| 6,159,810 * | 12/2000 | Yang .................................. | 438/593 |
| 6,171,959 * | 1/2001 | Nagabushnam .................... | 438/592 |

FOREIGN PATENT DOCUMENTS 05075136    3/1993    (JP) .

OTHER PUBLICATIONS

Zhang et al., "Work Function of Boron–Doped Polycrystalline $Si_xGe_{1-x}$ Films," IEEE Electron Device Letters, vol. 18, No. 9, Sep. 1997, pp. 456–458.

Jin et al., "Low–Temperature Annealing of Polycrystalline $Si_{1-x}Ge_x$ After Dopant Implantation," IEEE Transactions on Electron Devices, vol. 44, No. 11, Nov. 1997, 1958–1963.

Kistler et al., "Symmetric CMOS in Fully–Depleted Silicon–On–Insulator Using $P^+$–Polycrystalline Si–Ge Gate Electrodes," Dec. 1993, pp. 727–730.

\* cited by examiner

*Primary Examiner*—John F. Niebling
*Assistant Examiner*—Lynne Gurley
(74) *Attorney, Agent, or Firm*—Conley, Rose & Tayon, PC; Eric B. Meyertons

(57) ABSTRACT

A method which includes, prior to depositing the encapsulating silicon layer: A) depositing on the $Si_{1-x}Ge_x$ layer a thin film of amorphous or polycrystalline silicon, then in treating said silicon film with gas nitric oxide at a temperature between 450 to 600° C. and at a pressure level of $10^4$ to $10^5$ Pa to obtain a thin nitrided silicon film; or B) depositing on the $Si_{1-x}Ge_x$ layer a thin film of amorphous or polycrystalline silicon and oxidizing the silicon film to form a surface film of silicon oxide less than 1 nm thick and optionally treating the oxidized amorphous or polycrystalline silicon film with nitric oxide as in A). The invention is applicable to CMOS semiconductors.

20 Claims, 2 Drawing Sheets

Figure 1A:
Figure 1B:
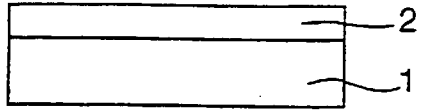
Figure 1C:
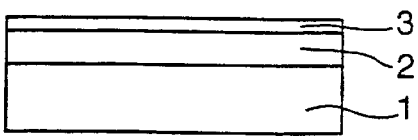
Figure 1D:
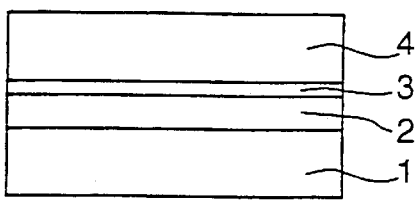
Figure 1E:
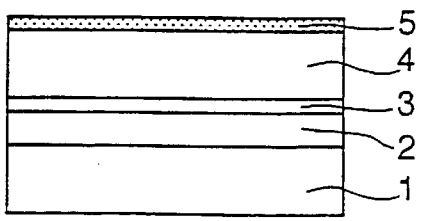
Figure 1F:
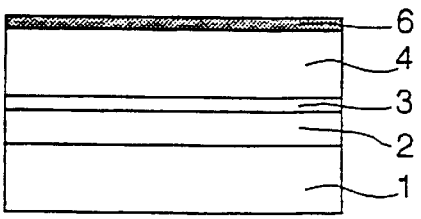
Figure 1G:
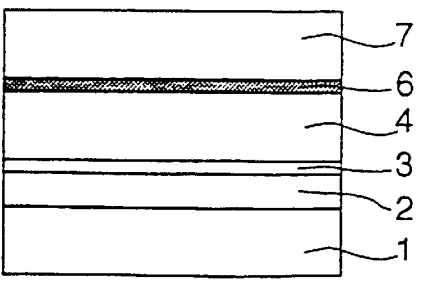

PROCESS FOR RESTRICTING INTERDIFFUSION IN A SEMICONDUCTOR DEVICE WITH COMPOSITE SI/SIGE GATE

The present invention generally relates to a process for restricting the interdiffusion of silicon and germanium in a semiconductor with composite $Si/Si_{1-x}Ge_x$, $0<x\leq 1$, gate, such as a CMOS device.

It has been shown that a gate structure including an $Si_{1-x}Ge_x$ layer is an advantageous alternative to PMOS technology.

The reason for this is that the material $Si_{1-x}Ge_x$, further to having, for equal doping, a lower resistance than polycrystalline silicon, offers the possibility of shifting the threshold voltage of the PMOS device obtained, as a function of the germanium content in the polycrystalline $Si_{1-x}Ge_x$ layer. It can thus be used as a "mid-gap" material in a $P^+$ gate structure instead of the traditional $P^+/N^+$ structure, that is to say, for example for N and P gun transistors with a simple gate containing a polycrystalline $Si_{1-x}Ge_x$ layer with $P^+$ conductivity.

Further, a gate with a very high concentration of germanium ($\geq$ to 75%) or made of pure germanium also has the advantage of being compatible at the same time for transistors of both types (N and P), which therefore leads to a saving in the technological step (elimination of at least two photolithography steps and, if the layer is doped in situ, of two implantation steps).

For instance, CMOS devices with composite SiGe gate are described in the articles "Symmetric CMOS in Fully Depleted Silicon on Insulator using $P^+$ Polycrystalline SiGe Gate Electrodes", Niel KIESTLER and JASON, IEDM 93, pages 727–730, and "A Polycrystalline-$Si/Si_{1-x}Ge_x$—Gates CMOS technology", T. KING et al.; IEDM 90, pages 253–256.

A semiconductor device with composite Si/SiGe gate typically includes a silicon oxide layer on a silicon semiconductor substrate, and, on the silicon oxide layer, generally a silicon bonding layer with a thickness less than or equal to 1 nm, and preferably about 0.5 nm, and, on this bonding layer, a polycrystalline $Si_{1-x}Ge_x$, $0<x\leq 1$, layer with a thickness of as much as 100 nm, but generally with a thickness of the order of 2 to 20 nm.

Above the $Si_{1-x}Ge_x$ layer, there is a silicon layer which may be either amorphous or polycrystalline. The latter layer is necessary because of the very high reactivity of germanium, and therefore of the SiGe alloy, with respect to oxygen and the subsequent difficulty which there is in siliciding the surface of the $Si_{1-x}Ge_x$ layer because of the poor reactivity of germanium and these compounds with the metals used for obtaining metal suicides, such as titanium for example.

Recent studies have shown that, even if the interface between the silicon and $Si_{1-x}Ge_x$ layers were initially indeed plane, abrupt and without roughness, the same was not true after the structure had been annealed, because the interdiffusion of germanium into the encapsulating silicon layer was then observed, principally through the grain junctures of the amorphous or polycrystalline silicon and vice versa, that is to say diffusion of silicon into the SiGe alloy layer through the grain junctions of this layer. The latter point is fundamental because it means that the germanium content of the $Si_{1-x}Ge_x$ layer will be depleted, and the threshold voltage will therefore be modified.

Although the use of amorphous silicon restricts this effect, this limitation of the germanium diffusion is still far from being satisfactory.

It would desirable to provide a process for restricting interdiffusion in a semiconductor with composite $Si/Si_{1-x}Ge_x$ gate which is rapid, industrially applicable, reliable and reproducible.

According to a first embodiment of the process for restricting interdiffusion, a thin layer of amorphous or polycrystalline silicon, typically with a thickness less than 25 nm, preferably between 2 nm and 20 nm, is deposited on the $Si_{1-x}Ge_x$ layer, then this silicon layer is nitrided by bringing the thin layer of amorphous or polycrystalline silicon into contact with the nitric oxide (NO) gas at a pressure of $10^3$ to $10^5$ Pa and a temperature of 450° C. to 600° C. The encapsulating silicon layer is then deposited in the conventional way.

According to a second embodiment of the process for restricting interdiffusion, a thin layer of amorphous or polycrystalline silicon is deposited on the $Si_{1-x}Ge_x$ layer, as indicated above, then a silicon oxide layer with a thickness less than or equal to 1 nm is formed on the surface of this thin surface layer of silicon before the complementary deposition of silicon is carried out in order to complete the encapsulating silicon layer. The thin silicon oxide layer may optionally be nitrided as described above.

Figure 2A:
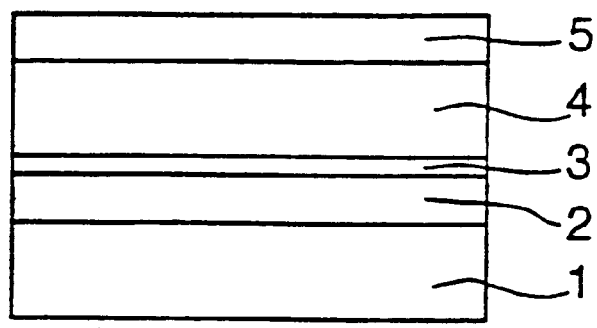
Figure 2B:
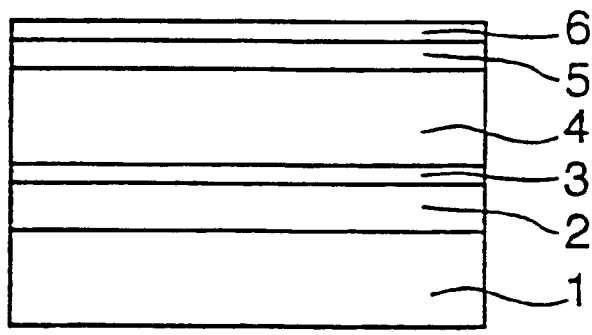
Figure 2C:
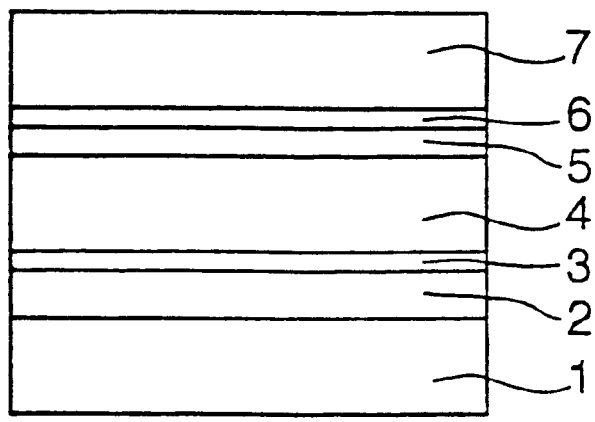

The rest of the description refers to the appended drawings, in which, respectively:

FIGS. 1a to 1g schematically represent the main steps of forming a composite $Si/Si_{1-x}Ge_x$ gate incorporating the first embodiment of the process for restricting diffusion;

FIGS. 2a to 2c schematically represent the main steps in the second embodiment of the process for restricting interdiffusion in a composite $Si/Si_{1-x}Ge_x$ gate.

Referring to the figures, and more particularly to FIGS. 1a to 1g, the various steps of a process for forming a composite $Si/Si_{1-x}Ge_x$ gate, incorporating a first embodiment of the process for restricting interdiffusion of germanium and silicon, has been schematically represented.

Conventionally, the first step in forming the composite gate includes forming a gate oxide ($SiO_2$) layer 2 on an amorphous, polycrystalline or monocrystalline silicon substrate 1. After the gate oxide layer 2 has been formed, a thin silicon bonding layer 3, generally having a thickness less than 3 nm, preferably less than or equal to 1 nm, and optimally about 0.5 nm, is formed on this layer.

This silicon layer may be deposited in a conventional way by chemical vapor deposition from a mixture of silane and hydrogen, at a temperature generally between 500 and 580° C., preferably 550° C., and at a generally atmospheric deposition pressure.

The duration of this step of depositing the silicon bonding layer is determined as a function of the other deposition conditions in order to ensure that the thickness of the bonding layer is less than 3 nm.

The $Si_{1-x}Ge_x$ layer 4, where $0<x\leq 1$, preferably $0.05\leq x\leq 1$, and optimally $0.25\leq x\leq 1$, or even better, $0.50\leq x\leq 1$, is then deposited on this silicon bonding layer 3.

This deposition may be carried out by chemical vapor deposition from a gas mixture of silane, germane and hydrogen.

The proportions of the various gases in the mixture vary as a function of the germanium and silicon contents desired for the $Si_{1-x}Ge_x$ layer, and can be determined with ease by the person skilled in the art as a function of the composition desired for this layer.

This deposition is generally carried out at a temperature of between 400 and 550° C., and preferably between 450 and 550° C. The higher the germanium content in the gas mixture is, the lower the deposition temperature may be.

Thus, for deposition of a pure germanium layer, the deposition temperature will preferably be between 400 and 450° C.

The total deposition pressure is generally atmospheric pressure.

The duration of the deposition is a function of the temperature and pressure conditions, the proportions of the various gases in the gas mixture and the thickness desired for the polycrystalline $Si_{1-x}Ge_x$ layer.

The thickness of the polycrystalline $Si_{1-x}Ge_x$ layer may generally be between 20 nm and 200 nm, preferably less than 100, generally 40 nm.

The next step, according to the invention, includes forming a layer for restricting interdiffusion before depositing the encapsulating silicon layer.

In the embodiment represented in FIGS. 1a to 1g, the formation of this layer for restricting interdiffusion includes firstly forming a thin layer of amorphous or polycrystalline silicon 5, typically having a thickness of 2 nm to 20 nm, preferably 2 to 10 nm, on the surface of the $S_{1-x}Ge_x$ [sic] layer 4.

This thin layer may be deposited by any conventional technique and, in particular, by chemical vapor deposition.

The surface of the thin silicon layer is then treated directly with NO gas at a temperature of 450 to 600° C. and a pressure varying from $10^3$ to $10^5$ Pa, for example at a temperature of 550° C. and a pressure of $10^4$ Pa, for a time of about 30 seconds, so as to nitride the thin silicon layer and thus obtain a thin layer of nitrided silicon 6.

The encapsulating silicon layer 7 is then deposited in a conventional way, for example by chemical vapor deposition from a mixture of silane and hydrogen.

The semiconductor device may then be completed in the conventional way.

Where appropriate, the $Si_{1-x}Ge_x$ layer and/or the encapsulating silicon layer 7 may be doped, for example, with boron or phosphorus atoms.

This doping may be carried out in the conventional way in situ at the same time as the deposition of these layers, for example by adding precursor gases of the dopant elements such as $B_2H_6$, $PH_3$ or $A_sH_3$ to the chemical vapor deposition gas mixtures.

FIGS. 2a to 2c relate to a second embodiment of the formation of a layer for restricting interdiffusion.

After having successively deposited a gate silicon oxide layer 2, a bonding silicon layer 3 and an $Si_{1-x}Ge_x$ layer 4, as before, on a silicon substrate 1, and having formed a thin layer of amorphous or polycrystalline silicon 5, as described above with reference to FIGS. 1a to 1d, this silicon layer 5 is surface-oxidized in order to form a surface silicon oxide layer 6 having a thickness less than or equal to 1 nm.

In general, this thin silicon oxide layer may be formed in the following way:

after cleaning the silicon surface, this surface is saturated with Si—H (and H—Si—H) bonds by immersion in a dilute solution of HF in water (typically of the order of 1% strength or less).

after rinsing with deionized water and drying (assisted or not using isopropyl alcohol), the surface thus treated is exposed in a reactor to an ozone ($O_3$) gas flow (typically at a temperature below 200° C., for a time shorter than 3 minutes) or in an ozonized water solution (typically ozone-saturated deionized water at room temperature).

In both cases, an equivalent oxide thickness less than or equal to 1 nm is obtained.

Optionally, this silicon oxide layer 6 with a thickness less than or equal to 1 nm may be nitrided using the process described above with reference to FIGS. 1a–1g.

In all cases, an encapsulating silicon layer 7 is deposited on the nitrided or unnitrided $SiO_2$ layer 6, as described above.

As indicated above with reference to FIGS. 1a to 1g, a doped gate material may be obtained by implanting dopant atoms such as boron or phosphorus atoms in the structure using a standard process.

Advantageously, in order to avoid any possible immobilization of the dopant atoms at the interface with the layer for restricting interdiffusion, it is recommended to dope the $Si_{1-x}Ge_x$ layer and/or the upper silicon layers in situ.

It should be noted that the nitriding process is self-limiting, that is to say there is rapid saturation of the concentration in nitrogen introduced at the interface for a given pair of parameters, temperature and pressure of nitric oxide.

Although the process has principally been described with reference to polycrystalline composite $Si_{1-x}Ge_x/Si$ gates, the process may also be employed with epitaxial and hetero-epitaxial layers, that is to say monocrystalline rather than polycrystalline, of buried CMOS-device channels where it is beneficial to prevent boron diffusion or germanium diffusion. In this case, however, the procedure is slightly more involved because it will be necessary to stop the growth of one layer and change to another reactor in order to carry out the formation of a nitrided layer (a silicon oxide layer not being recommended in this case because epitaxy could then be resumed) and then resume the growth in the first reactor.

Preferably, a reactor of the cluster or multi-chamber single-wafer type may be used, because it is then possible to go from one reactor to another under a controlled atmosphere.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. Process for forming a layer restricting the interdiffusion of silicon and germanium between a layer of $Si_{1-x}Ge_x$, $0<x\leq1$, and an encapsulating silicon layer of a semiconductor device with $Si/Si_{1-x}Ge_x$ gate, comprising:

depositing a thin layer of amorphous or polycrystalline silicon on the $Si/Si_{1-x}Ge_x$ layer; and treating the silicon layer with nitric oxide gas at a temperature of 450 to 600° C. and a pressure $10^3$ to $10^5$ Pa in order to obtain a layer of nitrided silicon.

2. Process according to claim 1, wherein the amorphous or polycrystalline silicon layer has a thickness less than 25 nm.

3. Process according to claim 2, wherein the amorphous or polycrystalline silicon layer has a thickness between 2 and 20 nm.

4. Process according to claim 1, wherein the treatment with NO gas is carried out at 550° C. under a pressure of $10^4$ Pa for 30 seconds.

5. Process according to claim 1, further comprising doping the $Si_{1-x}Ge_x$ layer in situ before the formation of the layer restricting the interdiffusion.

6. Process according to claim 1, further comprising doping the encapsulating silicon layer.

7. Process for forming a layer restricting the interdiffusion of silicon and germanium between a layer of $Si_{1-x}Ge_x$, $0<x\leqq1$ and a encapsulating silicon layer, comprising:

depositing a thin layer of amorphous or polycrystalline silicon on the $Si_{1-x}Ge_x$ layer; and oxidizing the deposited silicon layer to form a silicon oxide layer.

8. Process according to claim 7, wherein silicon oxide layer has a thickness less than about 1 nm.

9. Process according to claim 7, further comprising treating the silicon oxide layer with nitric oxide gas to obtain a layer of nitrided silicon oxide.

10. Process according to claim 7, wherein the amorphous or polycrystalline silicon layer has a thickness less than 25 nm.

11. Process according to claim 7, wherein the amorphous or polycrystalline silicon layer has a thickness between 2 and 20 nm.

12. Process according to claim 7, wherein the silicon oxide layer is formed by bringing the amorphous or polycrystalline silicon layer into contact with an atmosphere containing ozone or ozonized water.

13. Process according claim 7, further comprising subjecting the amorphous or polycrystalline silicon layer to a dilute aqueous hydrofluoric acid solution, prior to the formation of the silicon oxide layer.

14. Process according to claim 7, wherein the treatment with NO gas is carried out at 550° C. under a pressure of $10^4$ Pa for 30 seconds.

15. Process according to claim 7, further comprising doping the $Si_{1-x}Ge_x$ layer in situ before the formation of the layer restricting the interdiffusion.

16. Process according to claim 7, further comprising doping the encapsulating silicon layer.

17. Process for forming an interdiffusion restriction layer between a layer of $Si_{1-x}Ge_x$, $0<x\leqq1$, and an encapsulating silicon layer of a semiconductor device, comprising:

depositing a thin layer of amorphous or polycrystalline silicon on the $Si_{1-x}Ge_x$ layer; and treating the silicon layer with nitric oxide gas to convert the silicon layer into a nitrided silicon layer.

18. Process according to claim 17, wherein the treatment with NO gas is carried out at 550° C. under a pressure of $10^4$ Pa for 30 seconds.

19. Process according to claim 17, further comprising doping the $Si_{1-x}Ge_x$ layer in situ before the formation of the layer restricting the interdiffusion.

20. Process according to claim 17, further comprising encapsulating the $Si_{1-x}Ge_x$ layer and the nitrided silicon layer within a silicon layer.

* * * * *